(12) United States Patent
Wrazien et al.

(10) Patent No.: US 8,227,701 B2
(45) Date of Patent: Jul. 24, 2012

(54) RECONFIGURABLE ELECTRIC CIRCUITRY AND METHOD OF MAKING SAME

(75) Inventors: Stephen John Wrazien, Cranberry Township, PA (US); Florin Zavaliche, Cranberry Township, PA (US); Joachim Walter Ahner, Pittsburgh, PA (US); Tong Zhao, Cranberry Township, PA (US); Martin Gerard Forrester, Murrysville, PA (US); Shan Hu, Allison Park, PA (US)

(73) Assignee: Seagate Technology LLC, Cupertino, CA (US)

( * ) Notice: Subject to any disclaimer, the term of this patent is extended or adjusted under 35 U.S.C. 154(b) by 532 days.

(21) Appl. No.: 12/359,386

(22) Filed: Jan. 26, 2009

(65) Prior Publication Data

US 2010/0187583 A1 Jul. 29, 2010

(51) Int. Cl.
*H05K 1/03* (2006.01)
(52) U.S. Cl. ........................ 174/256; 174/250
(58) Field of Classification Search ............ 361/780, 361/305, 311, 313–315, 320, 321.2, 321.5, 361/326; 174/250–262; 428/469, 96.1, 411.1; 136/256, 252

See application file for complete search history.

(56) References Cited

U.S. PATENT DOCUMENTS

| | | | |
|---|---|---|---|
| 6,639,143 B2* | 10/2003 | Kim et al. ............... | 136/256 |
| 7,348,606 B2 | 3/2008 | Khan et al. | |
| 2003/0062553 A1* | 4/2003 | Ramesh et al. ............ | 257/295 |
| 2006/0231860 A1 | 10/2006 | Mishra et al. | |
| 2007/0114568 A1 | 5/2007 | Simin et al. | |
| 2008/0286587 A1* | 11/2008 | Ahner et al. ............ | 428/469 |
| 2009/0155931 A1* | 6/2009 | Ma et al. ................ | 438/3 |

OTHER PUBLICATIONS

A. A Ohtomo & H.Y. Hwang, A high-mobility electron gas at the LAAIo3/SrTio3 heterointerface, Nature, vol. 427, Jan. 29, 2004, p. 423-426.*
W. A. Harrison et al., "Polar Heterojunction Interfaces", Physical Review B, vol. 18, No. 8, Oct. 15, 1978, pp. 4402-4410.
J. Nieder et al., "One-dimensional lateral-field-effect transistor with trench gate-channel insulation", Appl. Phys. Lett., vol. 57, No. 25, Dec. 17, 1990, pp. 2695-2697.
A. Ohtomo et al., "Epitaxial growth and electronic structure of LaTiOx films", Applied Physics Letters, vol. 80, No. 21, May 27, 2002, pp. 3922-3924.
A. Ohtomo et al., "Artificial charge-modulation in atomic-scale perovskite titanate superlattices", Nature, vol. 419, Sep. 26, 2002, pp. 378-380.
A. Ohtomo et al., "A high-mobility electron gas at the LaAlO3/SrTiO3 heterointerface", Nature, vol. 427, Jan. 29, 2004, pp. 423-426.
A. Ohtomo et al., "Surface depletion in doped SrTiO3 thin films", Applied Physics Letters, vol. 84, No. 10, Mar. 8, 2004, pp. 1716-1718.
D. A. Muller et al., "Atomic-scale imaging of nanoengineered oxygen vacancy profiles in SrTiO3", Nature, vol. 430, Aug. 5, 2004, pp. 657-661.
S. Thiel et al., "Tunable Quasi-Two-Dimensional Electron Gases in Oxide Heterostructures", Science, vol. 313, Sep. 29, 2006, pp. 1942-1945.

* cited by examiner

*Primary Examiner* — Yuriy Semenenko
(74) *Attorney, Agent, or Firm* — Pietragallo Bosick & Gordon

(57) ABSTRACT

A reconfigurable electric circuit includes first and second crystalline material layers positioned adjacent to each other and forming a first interface, and a first ferroelectric layer positioned adjacent to the first crystalline material layer and having ferroelectric domains applying an electric field to regions of the first interface to induce a quasi two-dimensional electron gas in the regions, wherein at least one of the regions forms a gate and at least one of the regions forms a channel.

10 Claims, 7 Drawing Sheets

RECONFIGURABLE ELECTRIC CIRCUITRY AND METHOD OF MAKING SAME

BACKGROUND

Integrated circuits include a plurality of electronic devices including transistors, diodes, resistors, capacitors, etc. These devices can be fabricated in a substrate and connected to each other using conductors that may also be fabricated in the substrate. It is generally desirable to reduce the size of integrated circuits to allow for smaller packages, as well as to reduce power consumption and improve high frequency operation.

It is well known that current complementary metal oxide semiconductor (CMOS) technology faces many scaling challenges in order to continue to provide reliable, fast, miniaturized electronic circuitry. For example, lithographic patterning of transistor features is approaching the limits of its capabilities. In addition, CMOS processing is costly and time consuming, often requiring over 200 fabrication steps and 30 or more photolithographic mask steps.

Floating gate (FG) transistors are commonly employed in FLASH memory in electronic systems. Since FG transistors are fabricated using CMOS processing, they face the same technological challenges as CMOS transistors, as well as additional challenges such as increased lateral parasitic capacitance and reduced charge sensitivity.

In devices that include capacitors, small size capacitors with high capacitance values are difficult to fabricate because of the relatively low dielectric constant (k) of the dielectric materials currently used. To reduce the capacitor size for a given dielectric, both the capacitor plate size and the distance (d) between plates can be proportionally scaled down. While the former quantity is in principle limited only by the technical capabilities of the current lithographic techniques, attempts to reduce the distance d must take into account the increased possibility of an electrical breakdown.

A highly conductive quasi two-dimensional electron gas (q2DEG), based on interface polarity discontinuities has been reported in both semiconducting and oxide insulating multilayer structures. It has been further shown that an external electric field can control the conductance of the q2DEG. A reconfigurable electric circuitry approach based on q2DEG patterns defined by local ferroelectric polarization has been described in U.S. patent application Ser. No. 11/749,368, which is hereby incorporated by reference.

SUMMARY

In a first aspect, the invention provides an apparatus including first and second crystalline material layers positioned adjacent to each other and forming a first heterointerface, a first ferroelectric layer positioned adjacent to the first crystalline material layer and having a polarized region applying an electric field to the first heterointerface to induce a quasi two-dimensional electron gas in the first interface, third and fourth crystalline material layers positioned adjacent to each other and forming a second heterointerface, a second ferroelectric layer positioned adjacent to the third crystalline material layer and having a polarized region applying an electric field to the second heterointerface, and a third ferroelectric layer positioned between the first and second heterointerfaces, wherein the third ferroelectric layer has a coercive voltage lower than a coercive voltage of the first and second ferroelectric layers and greater than a voltage required to induce a quasi two-dimensional electron gas in the second heterointerface.

In a second aspect, the invention provides an apparatus including first and second crystalline material layers positioned adjacent to each other and forming a first interface, and a first ferroelectric layer positioned adjacent to the first crystalline material layer and having ferroelectric domains applying an electric field to regions of the first interface to induce a quasi two-dimensional electron gas in the regions, wherein at least one of the regions forms a gate and at least one of the regions forms a channel.

In a third aspect, the invention provides an apparatus including first and second crystalline material layers positioned adjacent to each other and forming a first heterointerface, a third crystalline material layer positioned adjacent to the second crystalline material layer and forming a second heterointerface, a first ferroelectric layer positioned adjacent to the first crystalline material layer and having a ferroelectric domain applying an electric field to a first region of the first heterointerface to induce a quasi two-dimensional electron gas in the first region of the first heterointerface, and a second ferroelectric layer positioned adjacent to the third crystalline material layer and having a ferroelectric domain applying an electric field to a first region of the second heterointerface to induce a quasi two-dimensional electron gas in the first region of the second heterointerface.

In a fourth aspect, the invention provides an apparatus including first and second crystalline material layers positioned adjacent to each other and forming a first heterointerface, third and fourth crystalline material layers positioned adjacent to each other and forming a second heterointerface, a first ferroelectric layer positioned adjacent to the first crystalline material layer and having a ferroelectric domain applying an electric field to a first region of the first interface to induce a quasi two-dimensional electron gas in the first region of the first heterointerface, and a second ferroelectric layer positioned between the second and third crystalline material layers and having a ferroelectric domain applying an electric field to a first region of the second heterointerface to induce a quasi two-dimensional electron gas in the first region of the second heterointerface.

In a fifth aspect, the invention provides an apparatus including first and second crystalline material layers positioned adjacent to each other and forming a first heterointerface, a third crystalline material layer positioned adjacent to the second crystalline material layer and forming a second heterointerface, a first ferroelectric layer positioned adjacent to the first crystalline material layer and having ferroelectric domains applying an electric field to the first heterointerface to induce a quasi two-dimensional electron gas in the first region of the first heterointerface, and a second ferroelectric layer positioned adjacent to the third crystalline material layer and having ferroelectric domains applying an electric field to the second heterointerface to induce a quasi two-dimensional electron gas in the first region of the second heterointerface.

In a sixth aspect, the invention provides a capacitor including a conductive layer, first and second crystalline material layers positioned on the conductive layer and adjacent to each other and forming a first heterointerface, a first ferroelectric layer positioned adjacent to the first crystalline material layer and having ferroelectric domains applying an electric field to the first heterointerface to induce a quasi two-dimensional electron gas in the first heterointerface, and a first electrode connected to a region of the first heterointerface including the quasi two-dimensional electron gas.

DETAILED DESCRIPTION OF THE INVENTION

Figure 2:
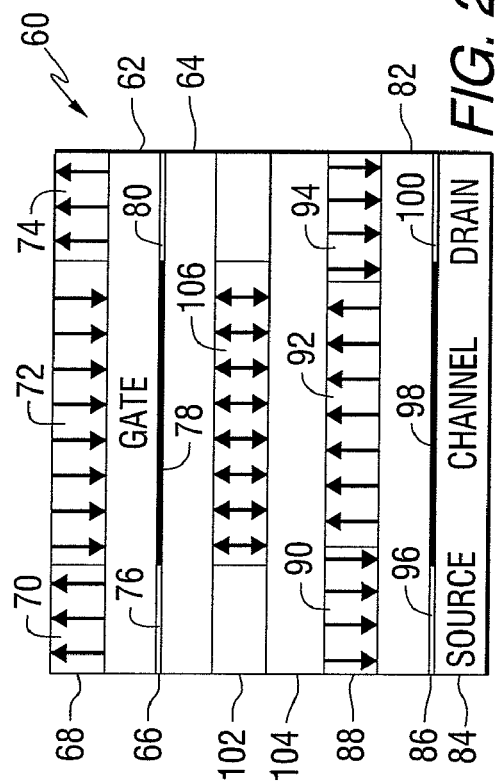
FIG. 2 is a schematic representation of a device constructed in accordance with another aspect of the invention.

In a layered structure having layers of crystalline materials, polarity discontinuities at the interface between different crystalline materials, i.e., heterointerfaces, can lead to a localized atomic and electronic structure. This localized atomic and electronic structure can be used to produce quasi two-dimensional electron gases (q2DEG) at the interfaces. The crystalline materials can be insulating oxides or semiconductors having doping layers that are spatially separated from the high-mobility quasi two-dimensional electron gas. The q2DEG contains electrons that are free to move in the in-plane direction, i.e., along the heterointerfaces. The q2DEG forms spontaneously when the electron-donating layer is greater than a critical thickness, and the conductance of the q2DEG can be controlled by the magnitude and polarity of an electric field introduced across the interface. When the electron-donating layer is thinner than the critical thickness, an applied electric field can induce the q2DEG. In either thickness case the required electric field can be produced by an adjacent ferroelectric layer or layers. While we primarily describe a mode of operation where the q2DEG is induced by the electric field, it is understood that the alternative, where the conductivity of a spontaneously occurring q2DEG is modulated by the electric field, is also applicable throughout.

In one aspect, this invention relates to electronic devices that include conductive quasi two-dimensional electron gases (q2DEG's) present at the interfaces of certain oxide films. A stack of specialized oxide films with one or more integrated ferroelectric layers can be used to fabricate various electronic devices. The thicknesses and properties of the films can be tailored to match each device and application. The film stacks form heterostructures that enable two-dimensional (2D) transistors to be fabricated with a single q2DEG and three-dimensional (3D) transistors to be fabricated using multiple q2DEG's.

Probe-based Reconfigurable Nanowire Technology can be used to fabricate a three-dimensional (3D) field effect transistor (FET) in a structure having conductive quasi two-dimensional electron gases (q2DEG's). One or more q2DEG gates may be formed to modulate the conductivity of a channel region between the source and drain contacts. A voltage can be applied to the gate(s) to turn the FET on (i.e., making the channel conductive) or to turn the FET off (i.e., making the channel non-conductive). The devices can exhibit amplification and may be patterned with dimensions of single nanometers. Such FET's may be used in the realization of nano-scale integrated circuitry and may enable the fabrication of entire integrated circuits without the complexity, cost, time or size of conventional CMOS technology.

The FET includes a first ferroelectric (FE) layer positioned adjacent to a first pair of oxide-based dielectric layers. One or more regions of the first ferroelectric layer are polarized to produce an electric field that induces a quasi two-dimensional electron gas at an interface of the first pair of oxide-based dielectric layers to form a gate of the FET. A second ferroelectric (FE) layer is positioned adjacent to a second pair of oxide-based dielectric layers. One or more regions of the second ferroelectric layer can be polarized to produce an electric field that induces a quasi two-dimensional electron gas at an interface of the second pair of oxide-based dielectric layers to form a channel of the FET, or affects the conductivity of an existing q2DEG.

One or more ferroelectric intermediate layers may be positioned between the gate and channel regions in order to provide non-volatile memory storage within the transistor assembly. The composition and thickness of the ferroelectric films can be tailored so that the coercive voltage of the intermediate FE film is lower than that of the first and second FE layers, but higher than the gate voltage required for inducing the q2DEG in the channel region of the device.

Figure 1:
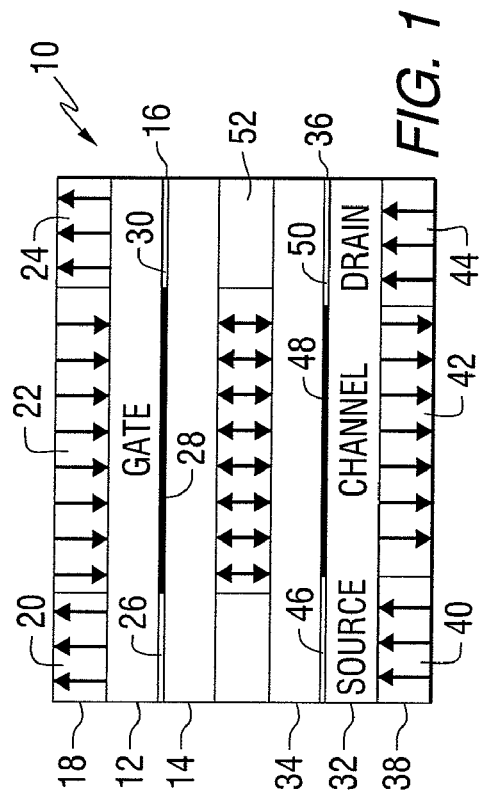
FIG. 1 is a schematic representation of a device constructed in accordance with an aspect of the invention.

FIG. 1 is a schematic representation of a device 10 constructed in accordance with an aspect of the invention. The device includes first and second crystalline material layers 12, 14 positioned adjacent to each other and forming a first interface 16. A first ferroelectric layer 18 is positioned adjacent to the first crystalline material layer 12 and includes polarized ferroelectric regions, or domains 20, 22, 24. The domains are electrically polarized and produce an electric field that is applied to adjacent regions 26, 28, 30 of the first interface. Third and fourth crystalline material layers 32, 34 are positioned adjacent to each other and form a second interface 36 between 32 and 34. A second ferroelectric layer 38 is positioned adjacent to the third crystalline material layer 32 and includes polarized ferroelectric regions, or domains 40, 42, 44 that are polarized and produce an electric field that is applied to regions 46, 48, 50 of the second interface. A third ferroelectric layer 52 is positioned between the first and second interfaces, wherein the third ferroelectric layer has a coercive voltage that is lower than a coercive voltage of the first and second ferroelectric layers and greater than a voltage required for inducing a quasi two-dimensional electron gas in the second interface. The direction of polarization in one or more regions of layer 52 can be used to represent a bit of data, for example polarization in a first direction may represent a logic one, and polarization in a second direction may represent a logic zero.

The device of FIG. 1 forms a field effect transistor (FET) with an intermediate memory layer. The q2DEG in region 28 serves as the FET gate, the q2DEG in region 48 serves as the FET channel, region 50 serves as the FET drain, and region 46 serves as the FET source.

In the above embodiment and in the following embodiments, the ferroelectric layers can be, for example, lead zirconium titanate, $(Pb(Zr,Ti)O_3)$, referred to as PZT, $BiFeO_3$, referred to as BFO, barium titanate $(BaTiO_3)$, referred to as BTO, or strained and therefore ferroelectric strontium titanate $(SrTiO_3)$, referred to as strained STO. The crystalline materials can be, for example, an oxide such as strontium titanate $(SrTiO_3)$, referred to as STO, lead vanadate $(PbVO_3)$, referred to as PVO, lanthanum aluminate $(LaAlO_3)$, referred to as LAO, lanthanum manganite (LaMnO$_3$), referred to as LMO, LaCaMnO$_3$, referred to as LCMO, LaSrMnO$_3$, referred to as LSMO, or a semiconductor such as a doped silicon, germanium, or GaAs.

FIG. 2 is a schematic representation of a device 60 constructed in accordance with another aspect of the invention. The device includes first and second crystalline material layers 62, 64 positioned adjacent to each other and forming a first interface 66. A first ferroelectric layer 68 is positioned adjacent to the first crystalline material layer 62 and includes ferroelectric domains 70, 72, 74. The domains are electrically polarized and produce an electric field that is applied to adjacent regions 76, 78, 80 of the first interface. Third and fourth crystalline material layers 82, 84 are positioned adjacent to each other and form a second interface 86. A second ferroelectric layer 88 is positioned adjacent to the third crystalline material layer 82 and includes ferroelectric domains 90, 92, 94 that are polarized and produce an electric field that is applied to regions 96, 98, 100 of the second interface. A third ferroelectric layer 102 is positioned between the first and second interfaces, wherein the third ferroelectric layer has a coercive voltage that is lower than a coercive voltage of the first and second ferroelectric layers and greater than a voltage required for inducing a quasi two-dimensional electron gas in the second interface. A fifth crystalline material layer 104 is positioned between the second and third ferroelectric layers. The device of FIG. 2 forms a field effect transistor (FET) with an intermediate memory layer. The q2DEG in region 78 serves as the FET gate, the q2DEG in region 98 serves as the FET channel, region 100 serves as the FET drain, and region 96 serves as the FET source. The direction of polarization in one or more regions 106 of layer 102 can be used to represent a bit of data, for example polarization in a first direction may represent a logic one, and polarization in a second direction may represent a logic zero.

Figure 3:
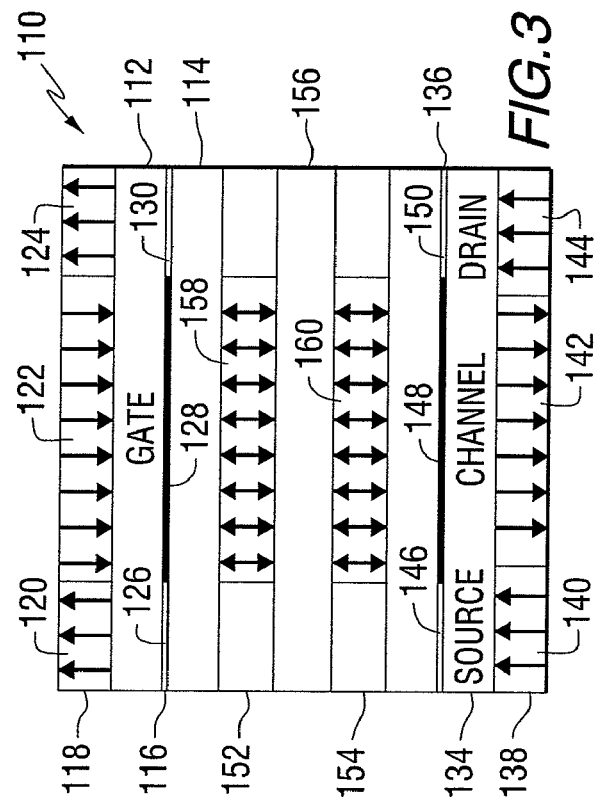
FIG. 3 is a schematic representation of a device constructed in accordance with another aspect of the invention.

FIG. 3 is a schematic representation of a device 110 constructed in accordance with another aspect of the invention. The device includes first and second crystalline material layers 112, 114 positioned adjacent to each other and forming a first interface 116. A first ferroelectric layer 118 is positioned adjacent to the first crystalline material layer 112 and includes ferroelectric domains 120, 122, 124. The domains are electrically polarized and produce an electric field that is applied to adjacent regions 126, 128, 130 of the first interface. Third and fourth crystalline material layers 132, 134 are positioned adjacent to each other and form a second interface 136. A second ferroelectric layer 138 is positioned adjacent to the fourth crystalline material layer 134 and includes ferroelectric domains 140, 142, 144 that can be polarized to produce an electric field that is applied to regions 146, 148, 150 of the second interface. A third ferroelectric layer 152 is positioned between the first and second interfaces, wherein the third ferroelectric layer has a coercive voltage that is lower than a coercive voltage of the first and second ferroelectric layers and greater than a voltage required for inducing a quasi two-dimensional electron gas in the second interface. A fourth ferroelectric layer 154 is positioned between the first and second interfaces, and a fifth crystalline material layer 156 is positioned between the third and fourth ferroelectric layers. The device of FIG. 3 forms a field effect transistor (FET) with two intermediate memory layers. The q2DEG in region 128 serves as the FET gate, the q2DEG in region 148 serves as the FET channel, region 150 serves as the FET drain, and region 146 serves as the FET source. The direction of polarization in one or more regions 158 of layer 152, and region 160 of layer 154 can be used to represent a bit of data, for example, polarization in a first direction may represent a logic one, and polarization in a second direction may represent a logic zero.

Once the gate, source and drain regions have been patterned in the devices of FIGS. 1-3, a voltage can be applied to the gate terminal. An external voltage source can be connected to the structure using, for example, embedded electrodes/interconnects, to apply a voltage to the gate terminal. The polarity of the voltage will determine the direction of the polarization in the intermediate ferroelectric layer(s), also called the memory FE layer(s) and designated as FE-m film, which will either promote or hinder the formation of the conductive q2DEG in the device channel. The memory polarization may either fully or partially activate (or deactivate) the channel of the device. The partial activation case can make it easier or more difficult for a gate voltage to influence the channel, giving the designer control over the turn-on voltage of the device. Once the gate voltage has been removed, the polarization of the FE-m film will remain, providing non-volatile storage of the memory bit. Since the coercivity of the FE-m film is higher than the turn on voltage of the FET, applying a nominal gate voltage will not disturb the memory state.

The memory can be non-destructively read by applying separate gate and drain biases and observing whether the channel conducts. Voltages will be tuned based on film thicknesses and device dimensions.

The devices of FIGS. 1, 2 and 3 are examples of a 3D FET with a ferroelectric memory (FE-m) film under the gate-level q2DEG. FIG. 3 is an example of a device that includes several FE-m films beneath the gate to partially promote or enhance the formation of the channel q2DEG, and to provide multi-level memory storage. In one example two FE layers have different coercive voltages, V1<V2. To write or destructively read layer 1, a voltage V can be applied, wherein V2>V>V1. To write or destructively read layer 2, a voltage V can be applied, wherein V>V2. Then layer 1 can be rewritten by applying a voltage V, wherein V2>V>V1.

For the case where the electron-donating layer (e.g. LAO) is below the critical thickness, an applied electric field of the correct polarity will induce a 2D electron gas. The electron gas can include high-mobility electrons such that it approaches the conductivity of a metal. The lateral location of the electron gas can be controlled by controlling the location at which the electric field is applied to the interface. Stable ferroelectric domains can be created in the ferroelectric layer. These ferroelectric domains generate an electric field at the interface. While the layers of the various examples are shown to be positioned immediately adjacent to each other, the crystalline material layers and ferroelectric layers could be separated by additional buffer layers or seed layers.

Figure 4:
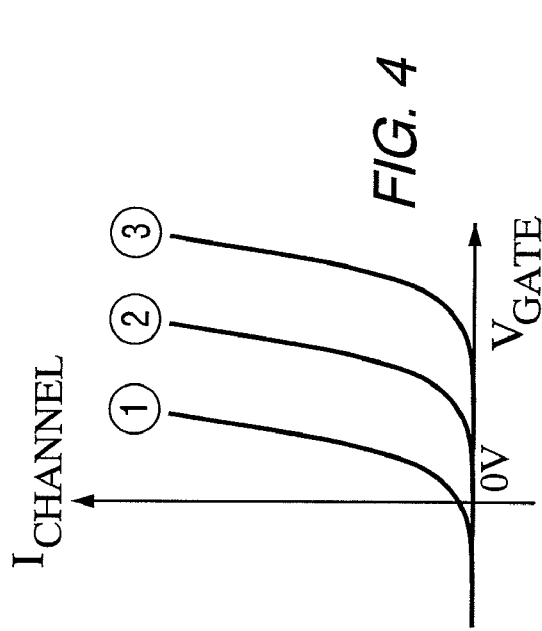
FIG. 4 is a graph of channel current versus gate voltage.

Several FE-m films beneath the gate can be used to partially promote or enhance the formation of the channel q2DEG. This is analogous to tuning the threshold voltage of a conventional CMOS transistor. FIG. 4 is a graph of current versus voltage with both FE-m polarizations up (1), one up and one down (2), or both down (3). The three cases demonstrate the capability of the devices to provide both a tunable turn-on voltage and multiple distinct memory states.

In one aspect of the invention, the fabrication of the device includes the use of additional thin film depositions and does not involve complicated etching processes or materials that are incompatible with the FET fabrication sequence. The memory devices are non-volatile and may retain the polarization of the FE-m film for many years at elevated temperatures. The thin film thicknesses may allow low voltages to be used in programming the devices, with minimal current flow, and hence may consume little power. The threshold voltage of the device may be tuned by the FE-m layer so that the device can be configured in either enhancement mode (always off) or depletion mode (always on) FETs, enabling both NAND and NOR memory architectures. FE-based memory may be programmed faster than conventional FLASH memory. The memory cells may be stacked vertically and laterally in order to obtain extremely high capacity storage.

Integrated circuits (IC's) may be fabricated in significantly less time than conventional electronics, since device patterning does not rely on multiple etches, implants, or photolithographic steps. Patterned FET's and circuits may be fully tunable so that individual devices may be reconfigured in order to optimize the design for a specific application, or to redesign the entire component. Several heterostructures may be stacked to reduce the lateral area, allowing for more complex circuits (more transistors) in a smaller area. Defective areas of the heterostructures may be simply ignored when patterning the circuitry, which is much simpler than the procedures required for mapping defects in conventional integrated circuits.

In another aspect of the invention, a two-dimensional (2D) in-plane gate (IPG) transistor, similar to a conventional GaAs—AlGaAs IPG, can be realized using a device having a single q2DEG. The two-dimensional nature of the in-plane gate (IPG) transistor eliminates the main contributors to conventional device capacitance, vertical gate-to-channel capacitance and junction capacitance. IPG transistors should theoretically be capable of operating at frequencies above 1 THz.

Figure 5:
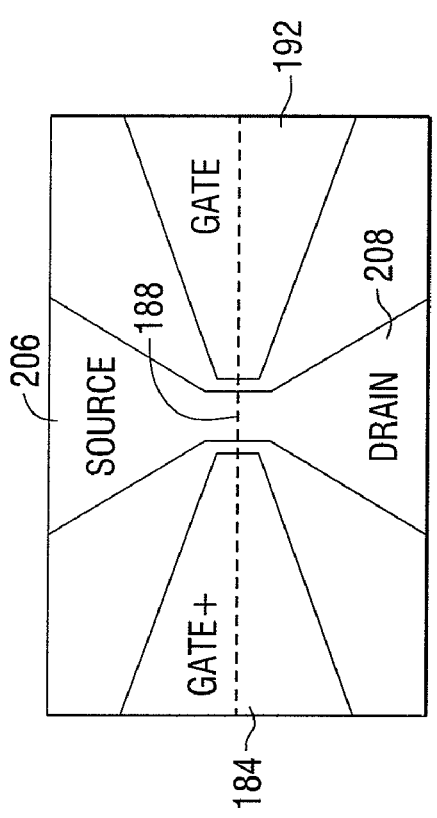
FIG. 5 is a schematic representation of a device constructed in accordance with another aspect of the invention.

FIG. 5 is a schematic representation of an in-plane gate transistor 170 constructed in accordance with an aspect of the invention. The device of FIG. 5 includes a plurality of crystalline material layers 172, 174, 176 and 178 on a substrate 180, which can be, for example, silicon. A ferroelectric layer 182 is formed on the crystalline material layer 172. Regions 184, 186, 188, 190 and 192 of the ferroelectric layer can be polarized as illustrated by the arrows in those regions to induce or inhibit the formation of a q2DEG in regions 194, 196, 198, 200 and 202 of the interface 204 between layers 172 and 174. In this example, the q2DEG in region 194 forms a first gate, the q2DEG in region 202 forms a second gate, and the q2DEG in region 198 forms a channel.

Figure 6:
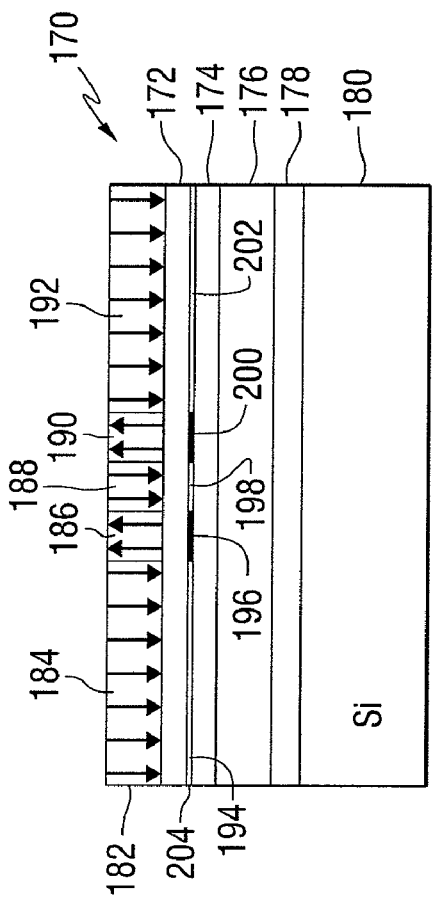
FIG. 6 is a plan view of the device of FIG. 5.

FIG. 6 is a plan view of the device of FIG. 5 taken along the interface 204. Gate regions 194 and 202 are shown to be positioned on opposite sides of the channel 198. A source region 206 is connected to a first side of the channel and the drain region 208 is connected to a second side of the channel.

The source and drain are connected via the channel. Gates are patterned on the two sides of the channel. All terminals (source, drain, gates) can be connected with vias to external circuitry. A bias can be applied to the drain of the device and electrons flow from the source to the drain. Applying a voltage to the gate modulates the conductivity of the electron gas at the center of the channel. Hence the device channel may be turned on by applying a gate voltage.

Figure 7:
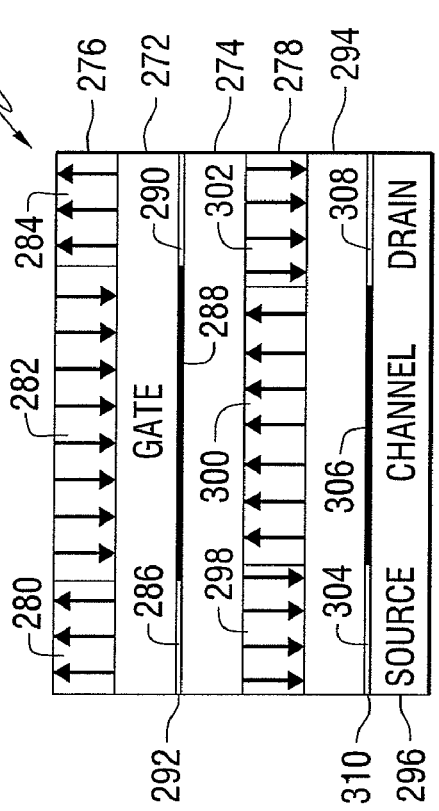
FIG. 7 is a schematic representation of a device constructed in accordance with another aspect of the invention.

FIG. 7 is a schematic side elevation view of a three-dimensional (3D) FET 220 including two parallel, overlapping q2DEG's. The device of FIG. 7 includes a plurality of crystalline material layers 222, 224 and 226 positioned between two ferroelectric layers 228 and 230. Regions 232, 234 and 236 of the ferroelectric layer 228 can be polarized as illustrated by the arrows in those regions to induce or inhibit the formation of a q2DEG in regions 238, 240 and 242 of the interface 244 between layers 222 and 224. Regions 246, 248 and 250 of the ferroelectric layer 230 can be polarized as illustrated by the arrows in those regions to induce or inhibit the formation of a q2DEG in regions 252, 254 and 256 of the interface 258 between layers 234 and 236. In this example, the q2DEG in region 240 forms a gate and the q2DEG in region 254 forms a channel.

The ferroelectric film nearest the q2DEG controls the lateral shape of the q2DEG. The source and drain can be patterned in the q2DEG in interface 258 by writing the appropriate pattern in layer 230. The gate can be patterned in the q2DEG in interface 244 by writing to layer 228. Interconnects can be provided to allow for applying external voltages and sensing currents. When a voltage is applied to the drain of the device, if there is no q2DEG between the source and drain, no current flows. A voltage may be applied to the gate to create a vertical field to induce the conductive q2DEG in the channel region, and a current will flow from the source to the drain. Three-dimensional structures require the coercive voltages of the FE films to be greater than the gate voltage required for turning on the channel.

FIG. 7 shows a multi-level electronic circuit including two q2DEGs. Two electronic circuit levels can be created at the top and bottom interfaces of a single insulating oxide layer. In such an approach, the number of layers needed is reduced as is the difficulty in making such a structure. More importantly, the two circuit levels are only separated by a single crystalline material layer (which can be for example less than 10 nm in thickness), and thus it is possible to electrically connect the two circuit levels for more complex circuit applications.

Multiple 2D and 3D heterostructures may be stacked or patterned side-by-side in order to fabricate large-scale electronic circuitry. Interconnects can provide vertical and lateral electrical connections between devices.

Figure 8:
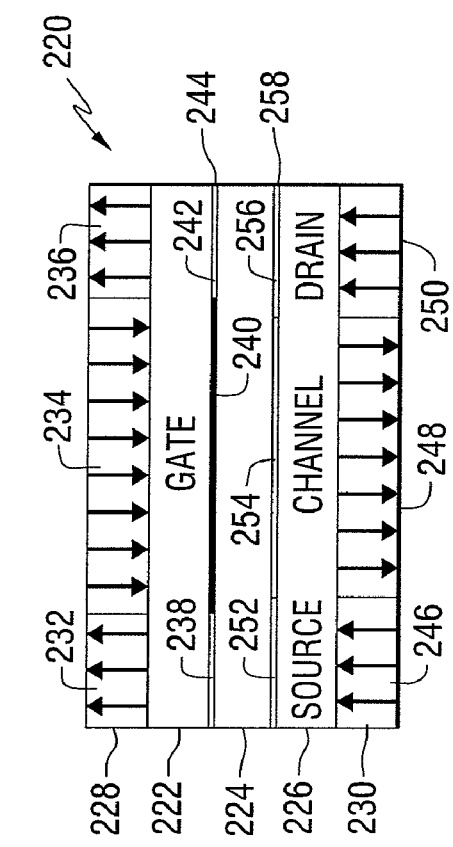
FIG. 8 is a schematic representation of a device constructed in accordance with another aspect of the invention.

FIG. 8 is a schematic representation of another three-dimensional (3D) FET 270. The device of FIG. 8 includes a first pair of crystalline material layers 272 and 274 positioned between two ferroelectric layers 276 and 278. Regions 280, 282 and 284 of the ferroelectric layer 276 can be polarized as illustrated by the arrows in those regions to induce or inhibit the formation of a q2DEG in regions 286, 288 and 290 of the interface 292 between layers 272 and 274.

A second pair of crystalline material layers 294 and 296 is positioned below ferroelectric layer 278. Regions 298, 300 and 302 of the ferroelectric layer 278 can be polarized as illustrated by the arrows in those regions to induce or inhibit the formation of a q2DEG in regions 304, 306 and 308 of the interface 310 between layers 294 and 296. In this example, the q2DEG in region 288 forms a gate and the q2DEG in region 306 forms a channel.

Figure 9:
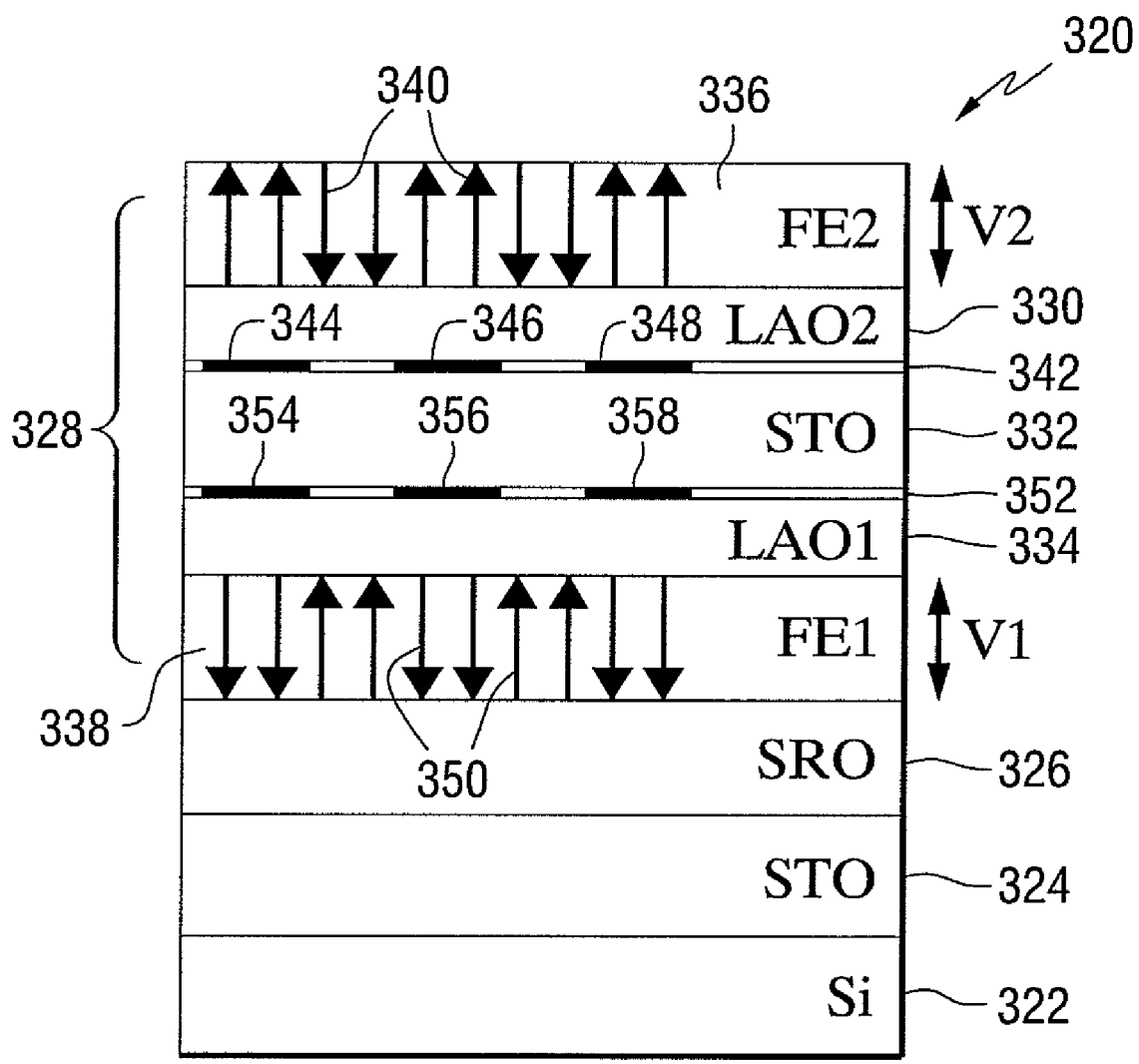
FIG. 9 is a schematic representation of a device constructed in accordance with an aspect of the invention.

FIG. 9 shows an electronic device 320 constructed in accordance with another aspect of the invention. The device includes a substrate 322 with a buffer layer 324 on the substrate. A bottom contact 326 is positioned on the buffer layer. A unit cell 328 is positioned on the bottom contact. The unit cell includes a stack of first, second and third crystalline material layers 330, 332 and 334, and ferroelectric layers 336 and 338 positioned on opposite sides of the stack of crystalline material layers. Regions of ferroelectric layer 336 can be polarized as illustrated by arrows 340 to induce or inhibit the formation of a quasi two-dimensional electron gas in an interface 342 between layers 330 and 332. In this example, the quasi two-dimensional electron gas is shown in regions 344, 346 and 348. Regions of ferroelectric layer 338 can be polarized as illustrated by arrows 350 to induce or inhibit the formation of a quasi two-dimensional electron gas in an interface 352 between layers 332 and 334. In this example, the quasi two-dimensional electron gas is shown in regions 354, 356 and 358.

As shown in FIG. 9, a conducting $SrRuO_3$ (SRO) layer on an $SrTiO_3$ (STO) buffered Si wafer serves as bottom contact (in another embodiment, different oxides can be used). A ferroelectric layer 338 with a coercive voltage, $V_{c1}$ is formed on top of the SRO layer. A thin layer 334 of LaAlO$_3$ (LAO) with a thickness of around 2 nm is deposited on top of ferroelectric layer 338, in such a way that it terminates with an LaO atomic layer on its top surface, wherein an LAO molecule contains two atomic layers, namely LaO and AlO$_2$. Then an STO layer 332 (having a thickness of, for example, less than 10 nm) is deposited in such a way that it terminates with a TiO$_2$ atomic layer on its top surface. A second LAO layer 330 with the substantially same thickness as the first one is deposited on top of the STO layer. Finally, there is a second ferroelectric layer 336 on top of the second LAO, with a coercive voltage of $V_{c2}$. The two ferroelectric layers are chosen such that $V_{c1} > V_{c2}$.

In the example of FIG. 9, the substrate 322 can be, for example, silicon. The buffer layer 324 can be, for example, strontium titanate (SrTiO$_3$), referred to as STO, dysprosium scandate (DyScO$_3$), referred to as DSO, or gadolinium scandate (GdScO$_3$), referred to as GSO. The electrically conductive layer 326 can be, for example, strontium ruthanate (SrRrO$_3$), referred to as SRO, or LaSrCoO$_3$, referred to as LSCO.

The q2DEGs at the two interfaces can be selectively turned on by establishing polarized regions of the ferroelectric layers. All of the STO and LAO films are insulating. The specific thickness and terminating atomic layers between STO and LAO layers make the interfaces 342 and 352 at an insulating ground state (i.e., without the modulation of an external electric field, it is always insulating). An up polarization in layer 336 will create a q2DEG and thus create conductive regions at interface 342 in the FIG. 9 oxide stack. A down polarization in layer 338 will do the same thing at interface 352. The two circuitries are separated by a single oxide layer 332.

The direction of polarization of regions of one of the FE layers can be selectively switched by applying a voltage V to the whole stack from top to bottom. A portion of the voltage drops across each insulating layer depending on the electrical impedance of the layers. Assume the voltage drops across layers 338 and 336 are V1 and V2, respectively. Then the polarization in both of the FE layers can be addressed separately. The applied voltage will not spread across the layers, as they are insulating. The width of the polarized regions is mainly determined by the product of the width of top electrode, which is used to apply the electric field onto the whole stack, and the length the electrode traveled. Of course, stray field at the electrode edge will make the actual area affected by the voltage a little larger than the electrode footprint. A fundamental limit on the lateral dimensions of the polarization region is the smallest stable ferroelectric domain size. But as the critical size of a ferroelectric material is in the order of a couple of crystal unit cells, that is less than 1 nm, it is far less than any practical factors affecting the polarization region dimensions.

For example, if a voltage is applied to the whole stack in such a way that $V1 > V_{c1}$ and $V2 > V_{c2}$, the polarizations in both of the FE layers are switched to the DOWN direction. This turns ON the q2DEG in interface 352 and turns OFF the q2DEG at interface 342.

If an opposite voltage is applied to the whole stack in such a way that $|-V1| < |V_{c1}|$ and $|-V2| > |V_{c2}|$, the polarization in layer 338 stays unchanged in the DOWN direction, as V1 is not high enough to switch it. On the other hand, the polarization in layer 336 is switched to the UP direction by $-V2$. Then the q2DEG at interface 342 is also turned ON. Thus by repeating the application of voltage to regions of the stack, certain conductance patterns can be written in both interfaces separated by the STO layer 332.

The two interfaces can be electrically coupled to each other. Since the two electric circuit levels created by the q2DEG at interfaces 342 and 352 are only separated by a thin STO layer, electrical coupling between them can be generated by, for example, capacitive coupling, an electric field effect, electric tunneling, etc. Therefore, two separate electric circuitries can be vertically connected to form a single, more complex, circuit.

By repeating the "unit cell" structure 328 indicated in FIG. 9, more two-level circuit structures can be created. In between two "unit cell" structures, another insulating layer might be needed to separate the polarization from the FE layers (i.e., to prevent opposite polarizations in two adjacent ferroelectric layers, which is energetically unfavorable, or to avoid head-to-head or tail-to-tail polarization configurations).

In another aspect of the invention, reconfigurable arrays of capacitors with high capacitance values can be fabricated using a probe technique on an epitaxial complex-oxide multilayer stack with polarity discontinuities. The high electron densities in the q2DEGs allow one to employ them as capacitor plates. Further, one can control the conductivity of the q2DEG by a field effect, which can be produced by a ferroelectric overlayer. Since the direction of polarization field can be flipped either up or down, the q2DEG can be set either off or on, respectively, enabling the reconfigurable printing of capacitor arrays.

Figure 10:
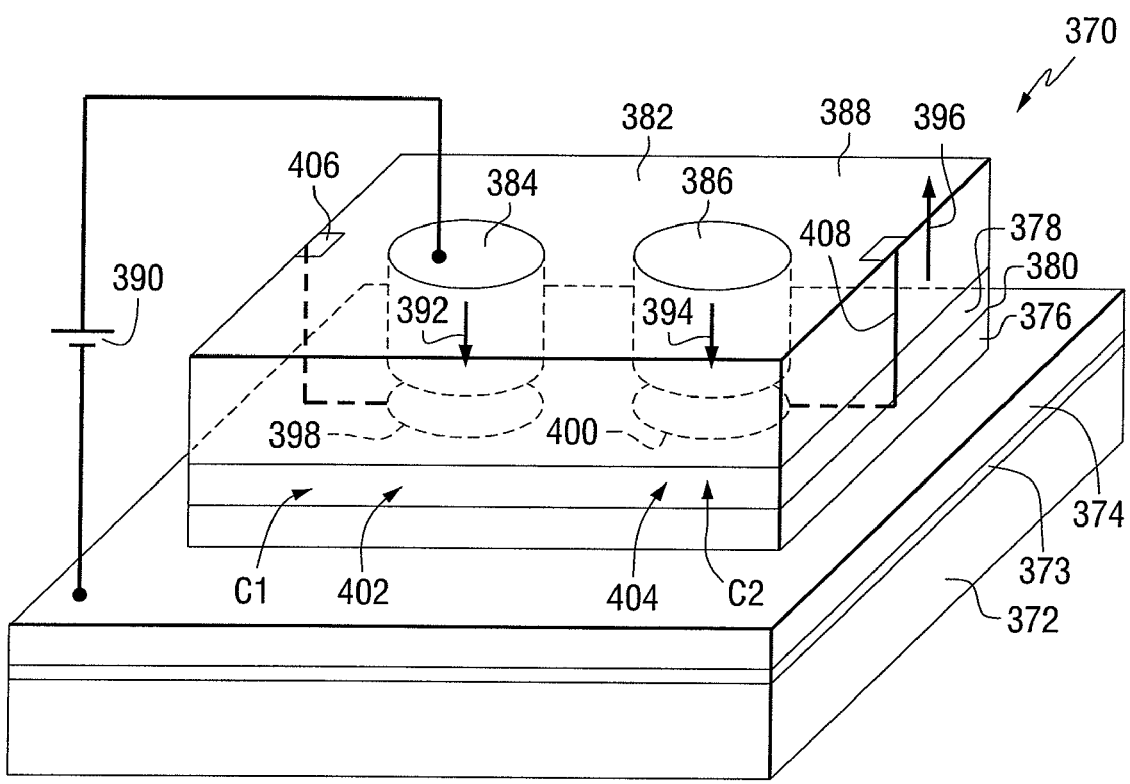
FIGS. 10, 11 and 12 are isometric views of other devices constructed in accordance with other aspects of the invention.

FIG. 10 is an isometric view of a q2DEG-based capacitor assembly 370. The assembly includes a substrate 372, which can be, for example, a buffered silicon substrate including a buffer layer 373, and a conducting layer 374 on the substrate. First and second oxide-based dielectric layers 376 and 378 are positioned on the conducting layer. An interface 380 is formed between the first and second oxide-based layers. A first ferroelectric layer 382 is positioned on the second oxide-based layer. Regions 384, 386 and 388 of the first ferroelectric layer can be polarized by applying a voltage between the first ferroelectric layer and the conducting layer, as illustrated by voltage source 390. The point of connection between the voltage source and the ferroelectric layer can be changed to control the location of the polarized regions in the ferroelectric layer. In the example of FIG. 10, regions 384 and 386 are polarized in a down direction as illustrated by arrows 392 and 394, while region 388 is polarized in an up direction as illustrated by arrow 396. The electric field from polarized regions 384 and 386 induces a q2DEG in regions 398 and 400 of the interface 380. The q2DEG in regions 398 and 400 of the interface 380 serve as top electrodes (or plates) of capacitors C1 and C2. The conducting layer 374 serves as a common bottom electrode (or plate) of capacitors C1 and C2. Regions 402 and 404 of the oxide-based layer 376 between the q2DEG in regions 398 and 400 and the bottom electrode serve as the dielectric material for capacitors C1 and C2. Conductors 406 and 408 provide means for connecting the top plates to an external circuit.

The top plate is written by turning on the q2DEG at the interface 380 by poling the ferroelectric (FE) layer in the down direction. The bottom conducting layer acts as the common plate. In this particular geometry, the high capacitance is achieved between the q2DEG gases at the interface 380 and the bottom conducting layer.

In contrast to the typical parameters of known capacitors, wherein the distance between plates is about 10 nm, and the dielectric constant $\in_0$ is about 3.9, the oxide-based dielectric layer 376 in FIG. 10 can have a thickness of about 1 nm, and a dielectric constant $\epsilon_0$ of about 100. This can enable drastic miniaturization without the loss of performance. Further, the fabrication of such capacitors with large capacitance values can be realized with a lithography-free technique, by using a probe-type approach. Devices with various capacitance values can be written, erased, and rewritten thanks to the use of adjacent FE layers. This geometry also enables full integration with a complex oxide multilayer-based reconfigurable circuitry.

In the example of FIG. 10, an epitaxial complex oxide-based multilayer containing one q2DEG with a ferroelectric overlayer can be used to write one of the capacitors' plates, while one continuous metal-like underlayer acts as the second capacitors' plate. The q2DEG is switched on and off by flipping the ferroelectric polarization down and up, respectively, with a probe in contact to the multilayer structure.

Figure 11:
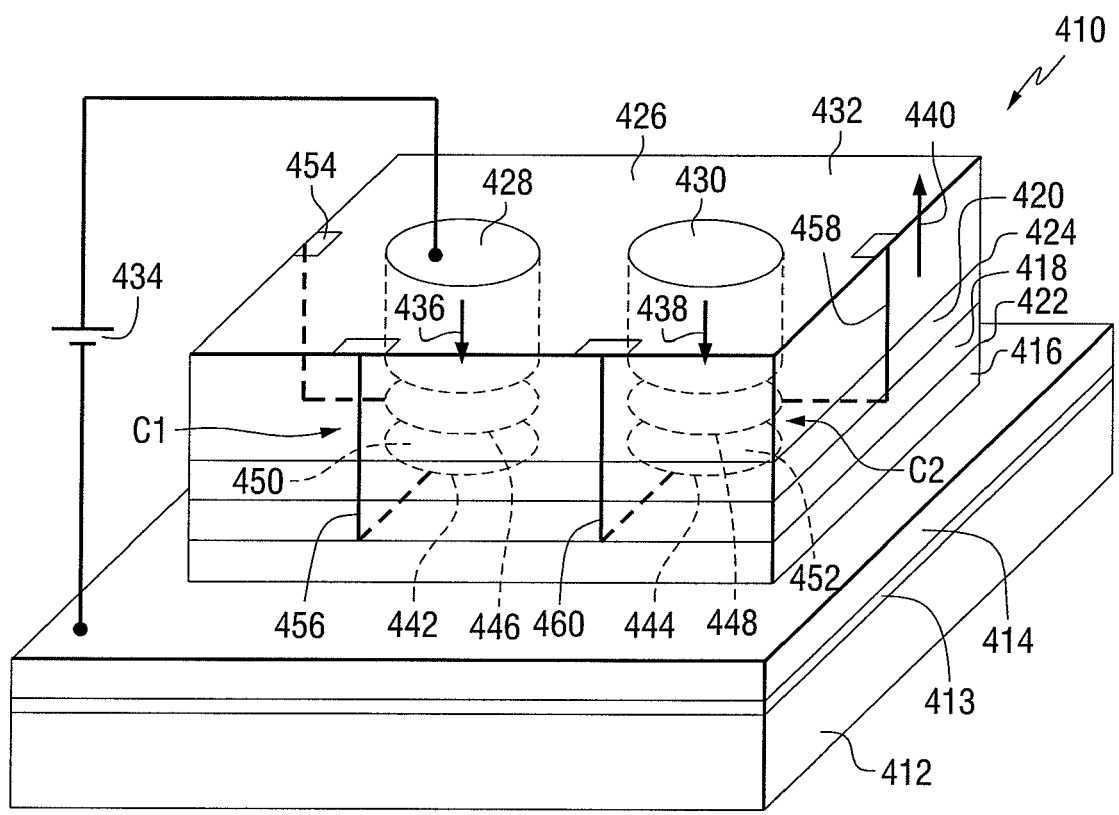

FIG. 11 illustrates another possible high-C q2DEG-based capacitor geometry. FIG. 11 is an isometric view of a q2DEG-based capacitor assembly 410. The assembly includes a substrate 412, which can be, for example, a buffered silicon substrate including a buffer layer 413, and a conducting layer 414 on the substrate. First, second and third oxide-based dielectric layers 416, 418 and 420 are positioned on the conducting layer. A first interface 422 is formed between the first and second oxide-based layers. A second interface 424 is formed between the second and third oxide-based layers. A first ferroelectric layer 426 is positioned on the third oxide-based layer. Regions 428, 430 and 432 of the first ferroelectric layer can be polarized by applying a voltage between the first ferroelectric layer and the conducting layer, as illustrated by voltage source 434. The point of connection between the voltage source and the ferroelectric layer can be changed to control the location of the polarized regions in the ferroelectric layer. In the example of FIG. 11, regions 428 and 430 are polarized in a down direction as illustrated by arrows 436 and 438, while region 432 is polarized in an up direction as illustrated by arrow 440. The electric field from polarized regions 428 and 430 induces a q2DEG in regions 442 and 444 of the interface 422, and regions 446 and 448 of the interface 424. The q2DEG in regions 442 and 444 of the interface 422 serves at bottom electrodes (or plates) of capacitors C1 and C2. The q2DEG in regions 446 and 448 of the interface 424 serves at top electrodes (or plates) of capacitors C1 and C2. Regions 450 and 452 of the second oxide-based layer 418 between the q2DEG in regions in the interfaces serves as the dielectric material for capacitors C1 and C2. Conductors 454, 456, 458 and 460 provide means for connecting the top and bottom plates to an external circuit.

The top and bottom plates can be written by turning on the q2DEG at the interfaces 422 and 424 by poling the ferroelectric (FE) layer in the down direction. Both plates are simultaneously written by turning on the q2DEG at the interfaces 422 and 424 by poling the ferroelectric (FE) layer in the down direction.

In the example of FIG. 11, an epitaxial complex oxide-based structure containing two q2DEGs with a ferroelectric overlayer is used to simultaneously write both of the capacitors' plates. A third epitaxial oxide layer is needed for the onset of the second q2DEG.

Figure 12:
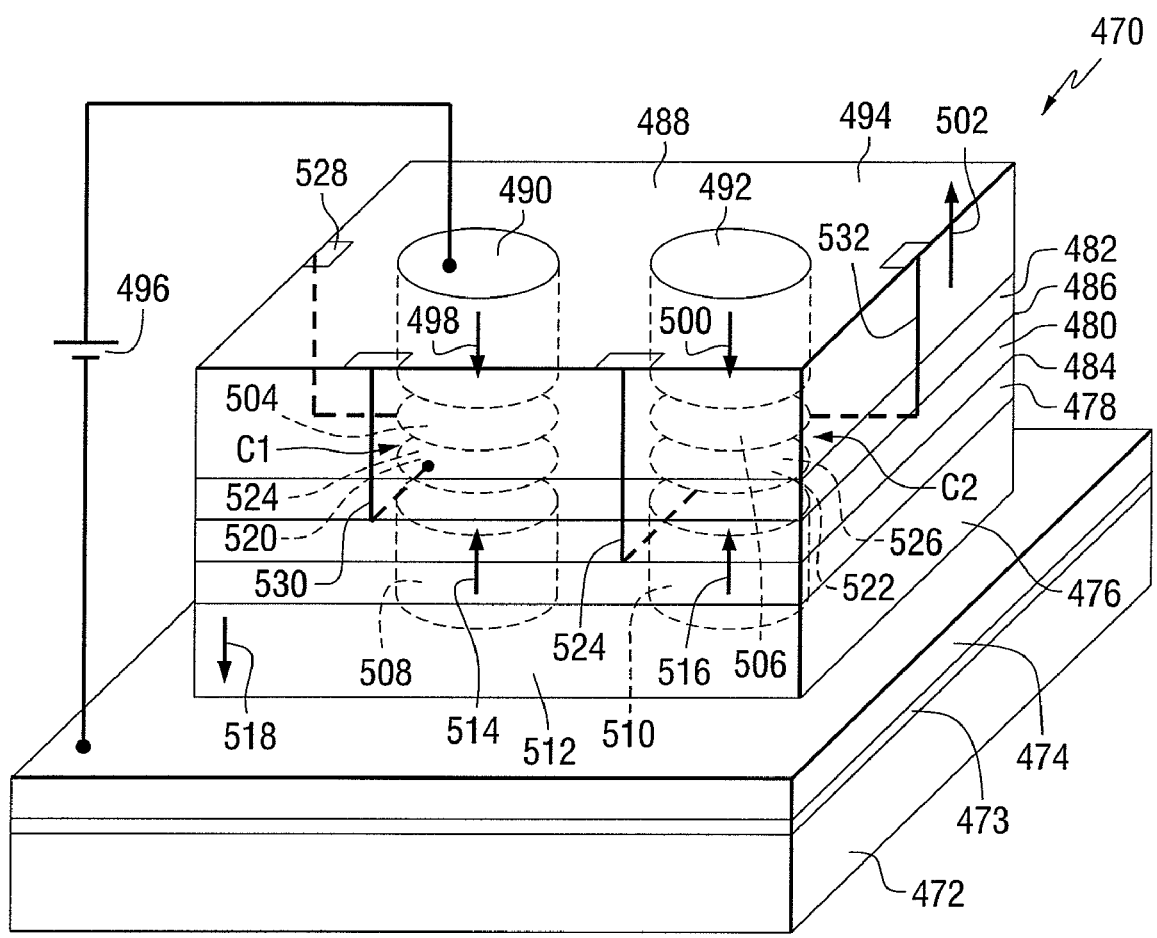

FIG. 12 is an isometric view of a two level q2DEG-based capacitor assembly 470 with an independently reconfigurable top plate. The assembly includes a substrate 472, which can be, for example, a buffered silicon substrate including a buffer layer 473, and a conducting layer 474 on the substrate. A first ferroelectric layer 476 is positioned on the conducting layer. First, second and third oxide-based dielectric layers 478, 480 and 482 are positioned on the first ferroelectric layer. A first interface 484 is formed between the first and second oxide-based layers. A second interface 486 is formed between the second and third oxide-based layers. A second ferroelectric layer 488 is positioned on the third oxide-based layer. Regions 490, 492 and 494 of the first ferroelectric layer can be polarized by applying a voltage between the first ferroelectric layer and the conducting layer, as illustrated by voltage source 496. The point of connection between the voltage source and the ferroelectric layer can be changed to control the location of the polarized regions in the ferroelectric layer. In the example of FIG. 12, regions 490 and 492 are polarized in a down direction as illustrated by arrows 498 and 500, while region 494 is polarized in an up direction as illustrated by arrow 502. The electric field from polarized regions 490 and 492 induces a q2DEG in regions 504 and 506 of the interface 486.

Regions 508, 510 and 512 of the first ferroelectric layer can be polarized as illustrated by arrows 514, 516 and 518. Regions 508 and 510 are polarized in a down direction as illustrated by arrows 514 and 516, while region 512 is polarized in an up direction as illustrated by arrow 518. The electric field from polarized regions 508 and 510 induces a q2DEG in regions 520 and 522 of the interface 484. The q2DEG in regions 520 and 522 of the interface 484 serves at bottom electrodes (or plates) of capacitors C1 and C2. The q2DEG in regions 504 and 506 of the interface 486 serves at top electrodes (or plates) of capacitors C1 and C2. Regions 524 and 526 of the second oxide-based layer 480 between the q2DEG in regions in the interfaces serves as the dielectric material for capacitors C1 and C2. Conductors 528, 530, 532 and 524 provide means for connecting the top and bottom plates to an external circuit.

The top plates can be written by turning on the q2DEG at the interface and 486 by poling regions of the ferroelectric (FE) layer 488 in the down direction. The bottom plates are written by turning on the q2DEG at interface 484 by poling the bottom ferroelectric layer in the up direction. The top plates are independently programmed at interface 486 by flipping the ferroelectric polarization in the top ferroelectric layer in the down direction.

In the example of FIG. 12, the bottom ferroelectric layer can be embedded in the complex oxide-based multilayer to independently write one of the capacitors' plates. In this example, the first ferroelectric layer lies adjacent to the conducting bottom layer and has a coercive voltage larger than the coercive voltage of the second ferroelectric layer. The bottom capacitor plates are programmed by enabling the q2DEG at interface 484. This is done by poling the bottom ferroelectric layer in the up direction. By applying a lower bias of opposite polarity, one can independently switch the ferroelectric polarization of regions in the top ferroelectric layer in the down direction. This will enable the q2DEG layer interface 486, which will act as the top plate of the proposed capacitor geometry.

In the examples of FIGS. 10-12, vertical electrical interconnects can be built into the structures by e.g., focused ion beam etching and metallization, local ion implantation or electrical activation of defects.

When fabricating the devices of various aspects of the invention, the ferroelectric layers are subjected to an electric field to create polarized ferroelectric domains in the ferroelectric layer that subject portions of the first interface to an electric field. The ferroelectric domains in the ferroelectric material can be polarized to maintain an electron gas along the first interface. The domains apply an electric field to the interface to maintain the electron gas in a pattern corresponding to the locations of the domains.

In some examples, the thickness of the first and second crystalline material layers can range from about 1 nm to about 5 nm. The thickness of the ferroelectric layers can range from about 5 nm to about 50 nm. The thickness of the electrically conductive layers can range from about 15 nm to about 100 nm. The thickness of the buffer layer can range from about 2 nm to about 50 nm. The thickness of the two crystalline material layers need not be the same.

Figure 13:
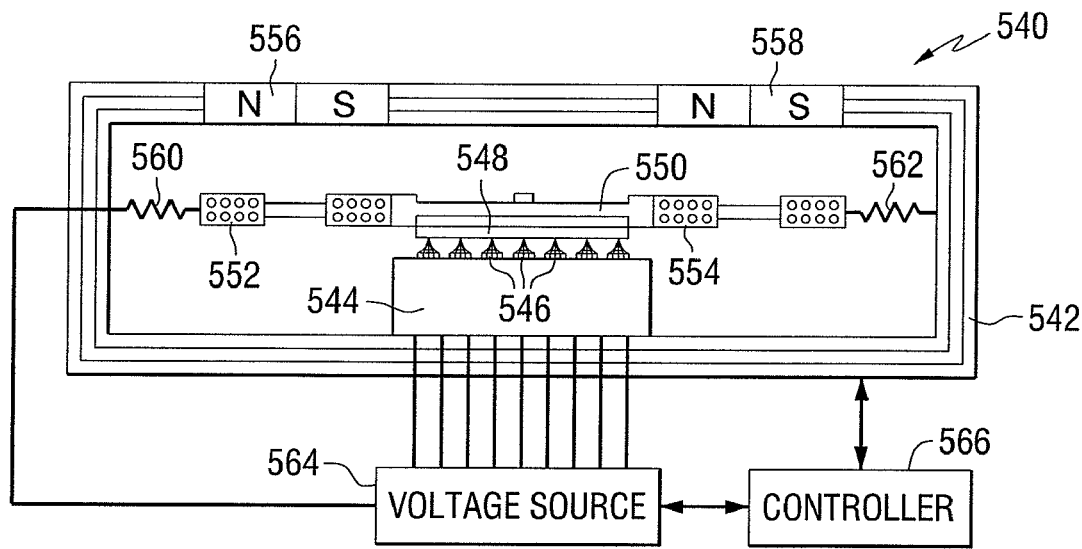
FIG. 13 is a schematic representation of an apparatus that can be used in the fabrication of devices in accordance with an aspect of the invention.

Multiple transducers can be used to apply voltage to the devices to polarize regions of the ferroelectric layers, increasing the speed with which circuits can be configured and reconfigured. FIG. 13 is a schematic representation of an apparatus for producing electrically polarized regions of the ferroelectric layers. FIG. 13 shows an apparatus 540 that includes actuators and suspension assemblies for providing relative movement between the medium and an array of transducers, which can be electrically conductive tips or probes. The apparatus 540 includes an enclosure 542, also referred to as a case, base, or frame, which contains a substrate 544. An array of transducers 546 is positioned on the substrate. The probes extend upward to make contact with a multilayer structure 548. The multilayer structure 548 is mounted on a movable member, or sled 550. In this example, relative movement between the multilayer structure 548 and the transducers is provided by an electromagnetic actuator that includes coils and magnets. Coils 552 and 554 are mounted on the movable member. Magnets 556 and 558 are mounted in the enclosure near the coils. Springs 560 and 562 form part of a suspension assembly that supports the movable member. The enclosure 542 can be formed of, for example, injection molded plastic. The actuators and suspension assembly shown in FIG. 13 are examples of structures that can provide relative displacement of transducers and a medium, which can contain rewritable circuitry. It will be understood by those skilled in the art that other types of actuators, such as surface drive capacitive actuators, could be used.

A voltage source 564 is electrically connected between a conductive layer in the multilayer structure and each of the transducers. The electrical connection to the conductive layer can be made, for example, through the springs, or using a separate conductor. Relative movement of the multilayer structure and the transducers is controlled by a controller 566. The controller can be programmed to control the actuators to move the sled in a desired pattern and to apply voltages to particular ones of the transducers at desired times to create the desired domain pattern in the ferroelectric layer of the multilayer structure. Sensors can be included to sense the position of the multilayer structure and/or the transducers and provide position signals for use by the controller.

While FIG. 13 shows one example of an apparatus that can be used to fabricate structures in accordance with an aspect of the invention, it will be recognized that other known types of suspensions and actuators can be used to position the components and to provide relative movement between the probes and the multilayer structure. This invention is not limited to any particular type of structure for providing relative movement between one or more transducers and a multilayer structure, or to any particular type of transducer or probe, or to any particular means for applying voltage to the multilayer structure.

When a voltage is applied between an electrode (or transducer) and the conducting layer under the ferroelectric film, the polarization of domains in the ferroelectric film can be switched locally in an up or down oriented polarization state, depending upon the amplitude and polarity of the applied voltage. When scanning a transducer over the multilayer structure, a pattern of up or down polarized domain states can be printed in the ferroelectric layer with a precision depending on the scanner accuracy and the size of the transducer electrode at the transducer-to-medium interface, also called the head-to-media interface. Such domain patterns are thermally stable and features down to about 16 nm in size have been demonstrated.

The ferroelectric layer domains provide an electric field pattern, which is used to maintain a conducting quasi two-dimensional electron gas (q2DEG) between two insulating dielectric oxide layers. The local confinement of the q2DEG is defined by the domain pattern written into the ferroelectric layer.

The q2DEG between dielectric perovskite films can have electron mobilities of up to $10^4$ $cm^2$/Vs. Any two-dimensional conducting circuitry with resolution down to about 16 nm can be written into the medium. Since the ferroelectric domain pattern is fully programmable (i.e., can be readily changed) by switching the polarization state, the circuitry is fully programmable (i.e., can be readily changed) and can be rewritten.

The domains in the ferroelectric layer subject the interface to an electric field in the vicinity of the domains. This maintains the electron gas at the interface locations that is subjected to the electric field.

The electric field associated with the ferroelectric domains is responsible for the conductance of the q2DEG. The electron gas would be closely confined only to areas adjacent to the up or down polarized domains. Field spreading in a lateral direction can be minimized by using very thin films. Also, the anisotropic dielectric permittivity of the ferroelectric films could be chosen or designed to minimize lateral field spreading. The conductance of the q2DEG can be switched on or off by changing the polarity of the domains in the ferroelectric film. The actual polarity of the field, which switches the q2DEG on or off depends on the materials of the interface and the location of the ferroelectric film. The whole ferroelectric film would be polarized. The q2DEG forms only in regions where the polarization is switched in the "active" direction, where the active direction is the direction that maintains the q2DEG for the particular materials used in the structure.

Electrical contact points can be created between the conductors as described above and the surface of the multilayer structure, or between layers of the multilayer structure. Such contact points can be created, for example using known lithographic techniques, using ion implantation, or using electrical breakdown of the medium layer.

Permanently conducting vertical wires could be formed by lithography methods, for example by etching holes and filling the holes with metals, by ion implantation through a hard mask, or by using the movable top electrode, or probe, and applying a voltage larger than the breakdown voltage of the films.

Rewritable vertical conductors may be formed by controlled doping and resistively switching the thin films between the transducer electrode and q2DEG interface. Reversible resistive switching in oxide films, including ferroelectrics typically occurs after doping and applying a voltage pulse to the transducer electrode, with an amplitude larger than the switching voltage for the ferroelectric film, but lower than the breakdown voltage.

Figure 14:
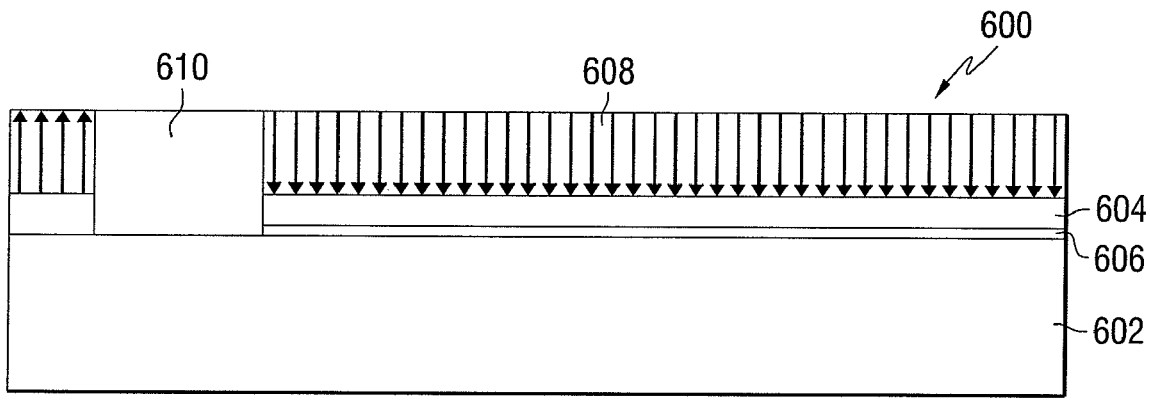
FIG. 14 is a side view of a device that includes an electrical connection to a q2DEG layer.
Figure 15:
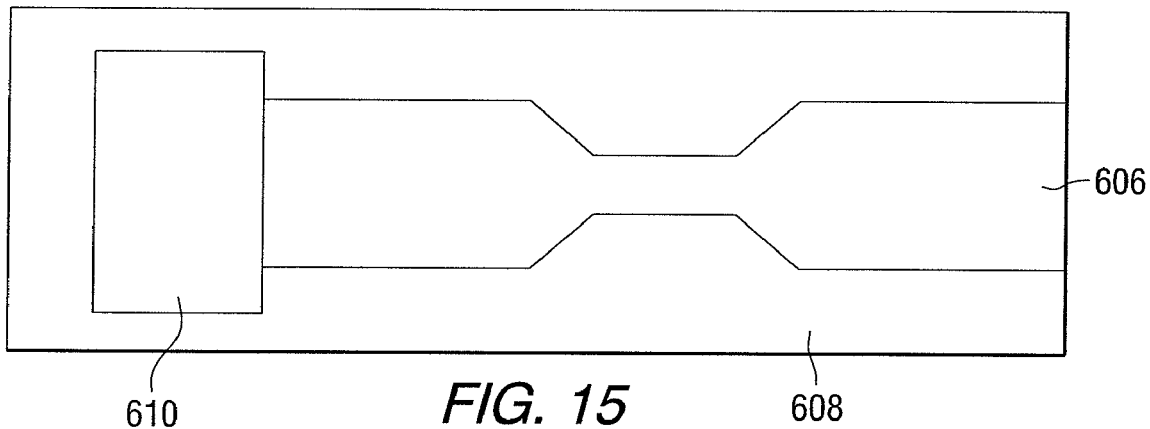
FIG. 15 is a top view of the device of FIG. 14.

One possible contact scheme for q2DEG includes conductive contacts, e.g., Au, through vias to the buried q2DEG interface. These vias would be fixed in location and size, and rewritable circuitry would be defined with a scanning probe subject to the limitations of these fixed contacts. FIG. 14 is a side view of a device 600 that includes an electrical connection to a q2DEG. FIG. 15 is a top view of the device of FIG.

14. Device 600 includes first and second crystalline material layers 602 and 604 positioned adjacent to each other to form a heterointerface 606. A ferroelectric layer 608 is positioned adjacent to layer 604. Portions of the layer 608 can be polarized to produce an electric field that can be used to form a q2DEG at the heterointerface. An electrical contact 610, which can be an Au via, extends to the q2DEG. Other contact schemes can be used as described earlier, e.g., doping, deliberate electrical breakdown of the LAO.

While the invention has been described in terms of several examples, it will be apparent to those skilled in the art that various changes can be made to the disclosed examples, without departing from the scope of the invention as set forth in the following claims. The implementations described above and other implementations are within the scope of the following claims.

What is claimed is:

1. An apparatus comprising:
   first and second crystalline material layers positioned adjacent to each other and forming a first heterointerface;
   a third crystalline material layer positioned adjacent to the second crystalline material layer and forming a second heterointerface;
   a first ferroelectric layer positioned adjacent to the first crystalline material layer and having a ferroelectric domain applying an electric field to a first region of the first heterointerface to induce a quasi two-dimensional electron gas in the first region of the first heterointerface; and
   a second ferroelectric layer positioned adjacent to the third crystalline material layer and having a ferroelectric domain applying an electric field to a first region of the second heterointerface to induce a quasi two-dimensional electron gas in the first region of the second heterointerface.

2. The apparatus of claim 1, wherein the crystalline material layers comprise one of:
   an oxide-based dielectric, or a semiconductor.

3. The apparatus of claim 1, wherein:
   the ferroelectric layers comprise one of: $Pb(Zr,Ti)O_3$, $BiFeO_3$, $BaTiO_3$, or strained $SrTiO_3$; and
   the first and second crystalline material layers comprise one of: $SrTiO_3$, $PbVO_3$, $LaAlO_3$, $LaMnO_3$, $LaCaMnO_3$, $LaSrMnO_3$, or a doped silicon, germanium, or GaAs.

4. The apparatus of claim 1, wherein the
   first ferroelectric layer further includes a plurality of ferroelectric domains applying an electric field to the first heterointerface; and wherein the
   the second ferroelectric layer includes a plurality of ferroelectric domains applying an electric field to the second heterointerface.

5. The apparatus of claim 4, further comprising:
   a substrate;
   a first oxide layer, on the substrate; and
   a second oxide layer on the first oxide layer, wherein the second ferroelectric layer is on the second oxide layer.

6. The apparatus of claim 5, wherein the first oxide layer comprises one of $SrTiO_3$, $DyScO_3$, or $GdScO_3$, and the second oxide layer comprises one of $SrRrO_3$, or $LaSrCoO_3$, on the $SrTiO_3$, $DyScO_3$, or $GdScO_3$.

7. The apparatus of claim 1, further comprising:
   a substrate;
   a first oxide layer, on the substrate; and
   a second oxide layer on the first oxide layer, wherein the second ferroelectric layer is on the second oxide layer.

8. The apparatus of claim 7, in the first oxide layer comprises one of $SrTiO_3$, $DyScO_3$, or $GdScO_3$, and the second oxide layer comprises one of $SrRrO_3$, or $LaSrCoO_3$, on the $SrTiO_3$, $DyScO_3$, or $GdScO_3$.

9. The apparatus of claim 1, wherein the first region of the first heterointerface forms a gate, and wherein the first region of the second heterointerface forms a channel.

10. The apparatus of claim 9, wherein the first and second ferroelectric layers have a coercive voltage greater than a gate voltage for turning on the channel.

* * * * *